(12) United States Patent
Chew et al.

(10) Patent No.: US 8,415,236 B2
(45) Date of Patent: Apr. 9, 2013

(54) METHODS FOR REDUCING LOADING EFFECTS DURING FILM FORMATION

(75) Inventors: Han Guan Chew, Singapore (SG); Jinping Liu, Singapore (SG); Alex Kai Hung See, Singapore (SG); Mei Sheng Zhou, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 577 days.

(21) Appl. No.: 12/648,309

(22) Filed: Dec. 29, 2009

(65) Prior Publication Data
US 2010/0167505 A1 Jul. 1, 2010

Related U.S. Application Data

(60) Provisional application No. 61/141,232, filed on Dec. 29, 2008.

(51) Int. Cl.
*H01L 21/20* (2006.01)
(52) U.S. Cl.
USPC ........................................................ 438/478
(58) Field of Classification Search .................. 438/300, 438/478
See application file for complete search history.

(56) References Cited

U.S. PATENT DOCUMENTS

| 7,605,060 | B2 * | 10/2009 | Meunier-Beillard et al. | 438/478 |
|---|---|---|---|---|
| 2007/0148921 | A1 * | 6/2007 | Yan et al. | 438/481 |
| 2009/0087967 | A1 * | 4/2009 | Todd | 438/507 |
| 2010/0035419 | A1 * | 2/2010 | Dube et al. | 438/494 |
| 2011/0124169 | A1 * | 5/2011 | Ye et al. | 438/299 |

* cited by examiner

*Primary Examiner* — Bradley K Smith
(74) *Attorney, Agent, or Firm* — Horizon IP Pte. Ltd.

(57) ABSTRACT

A method for fabricating a semiconductor device is provided. The method comprises selectively forming a first layer over a first and second exposed portions of a substrate. The first and second exposed portions are of different sizes and are located adjacent to a first and second active devices. During the first layer formation, a gas mixture comprising first and second source gases that function as growth components for forming the first layer and a reactant gas that functions as an etching component for controlling selectivity of the first layer growth is provided. The reactant gas is different from the first and second source gases and one of first and second source gases forms the first layer at a faster rate over the first exposed portion as compared to the second exposed portion and the other source gas exhibits an opposite behavior.

20 Claims, 5 Drawing Sheets

METHODS FOR REDUCING LOADING EFFECTS DURING FILM FORMATION

FIELD OF THE INVENTION

The present invention relates generally to methods of fabricating semiconductor devices and in particular, to methods for mitigating differences in resultant film thickness caused by loading effects.

BACKGROUND OF THE INVENTION

Integrated circuits (ICs) are used in many portable electronic products, such as cell phones, portable computers, and voice recorders as well as in many larger electronic systems, such as cars, planes, industrial control systems, etc. The continuing trend within the semiconductor industry is to form these integrated circuits on semiconductor substrates that have increasingly higher device densities and smaller device feature size (i.e., smaller critical dimensions). Unfortunately, this continued shrinkage and increased device density for integrated circuits brings with it new problems. One such problem is the variation in deposited film thickness as a function of feature geometry.

For example, one potential problem is when selective epitaxy processes deposit epilayers of different thicknesses at different regions of an IC. Selective epitaxy involves the selective deposition of epilayers over mono-crystalline regions without the simultaneous deposition of amorphous or polycrystalline layers over dielectric material and/or amorphous regions. The mono-crystalline regions where epilayers are formed thereover are referred to as seed windows. Selective epitaxy may be used in the formation of semiconductor device features such as elevated source/drain, embedded stress inducing layers, base layers of bipolar transistors and contact plugs.

Variations in epilayer thickness deposited on similar device features of an IC are undesirable as this may lead to a corresponding variation in device characteristics such as sub-threshold characteristics, threshold voltage roll-off and drain induced barrier lowering and consequently degraded device yield.

In view of the above, deposition methods that mitigate growth rate variations caused by loading effect are desirable.

SUMMARY OF THE INVENTION

The present invention relates to semiconductor devices and methods for fabrication thereof.

In accordance with one aspect of the invention, a method for fabricating a semiconductor device is provided. The method comprises providing a substrate including a first and a second device structures and forming a first and a second exposed portions of the substrate adjacent to the first and second device structures, wherein the first and second exposed portions are of different size. The method further includes forming a first layer over the first and second exposed portions of the substrate by using a gas mixture comprising first and second source gases that function as growth components for forming the first layer wherein one of first and second source gases forms the first layer at a faster rate over the first exposed portion compared to the second exposed portion and the other source gas exhibits an opposite behavior. The use of two source gases for growing the first layer helps to mitigate variations in the thickness of the first layer due to differences in exposed portion size.

These and other aspects, along with advantages and features of the present invention herein disclosed, will become apparent through reference to the following description and the accompanying drawings. Furthermore, it is understood that the features of the various embodiments described herein are not mutually exclusive and can exist in various combinations and permutations.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which.

DETAILED DESCRIPTION OF THE INVENTION

Figure 1:
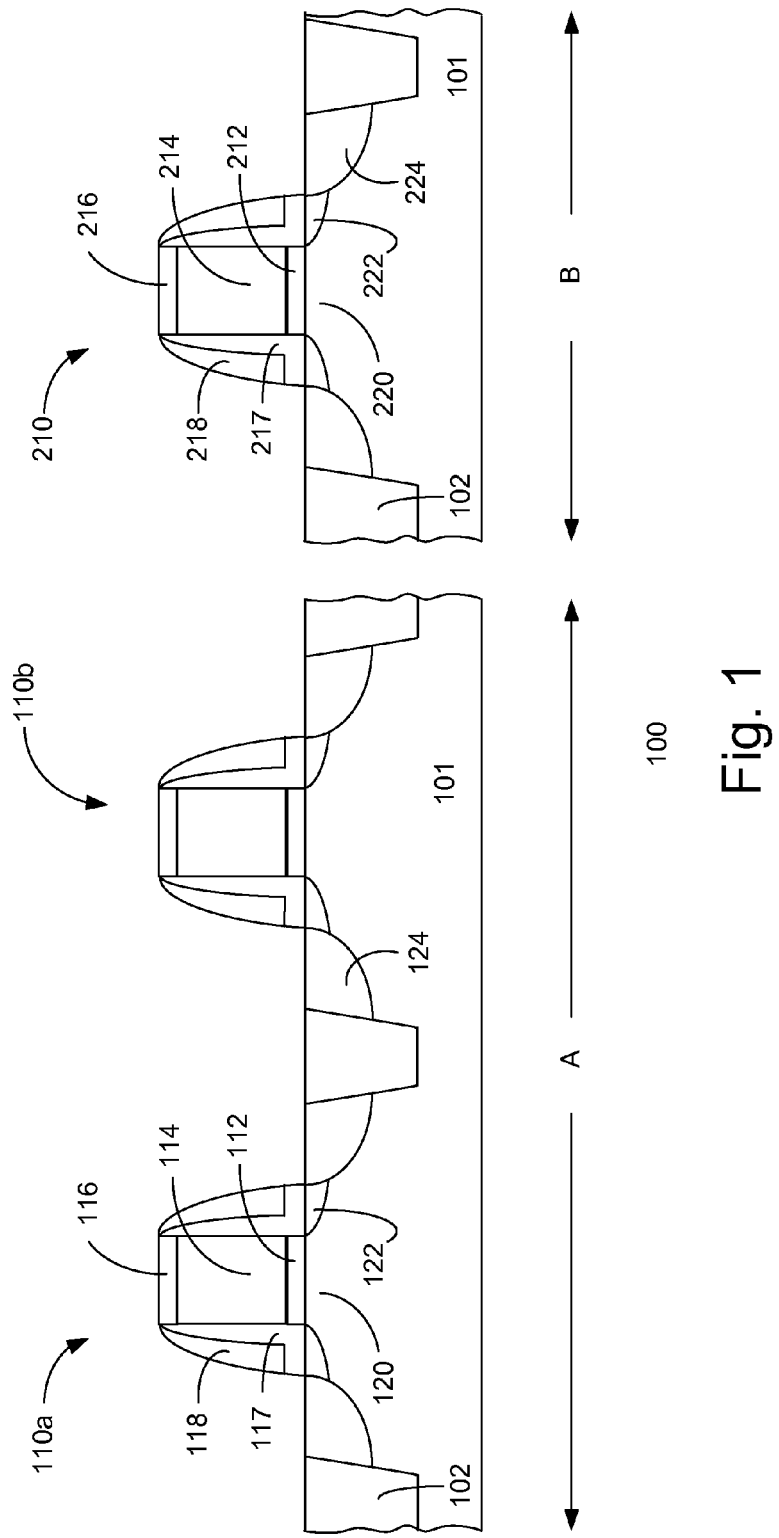
FIGS. 1 to 4 are schematic cross-sectional views illustrating the results of progressive stages in fabricating an integrated circuit system in accordance with an embodiment of the invention.

One or more aspects of the present invention will now be described with reference to the attached figures, wherein like reference numerals are used to refer to like elements throughout, and wherein the various structures are not necessarily drawn to scale.

Generally, the following embodiments relate to methods of fabricating semiconductor devices in a manner that reduces deposition rate dependency on device feature size.

FIGS. 1-4, which follow, depict by way of example and not by limitation, one or more exemplary methods for forming metal-oxide-semiconductor (MOS) transistors with embedded stress inducing layers. It is to be understood that the MOS transistors presented in these figures merely represent one example or illustration of how the concepts of the present invention may be applied. There is no intention to limit the application of the present invention to the fabrication of MOS transistors or the formation of embedded stress inducing layers. The invention may also be used in selective epitaxial processes for the formation of other features on a semiconductor device such as but not limited to elevated source/drain, base layers of bipolar transistors and contact plugs.

Additionally, it is also to be appreciated that a plurality of conventional processes that are well known in the art and not repeated herein, may precede or follow FIGS. 1-4. Moreover, it is to be understood that many modifications, additions, and/or omissions may be made to the below described processes without departing from the scope or spirit of the claimed subject matter. For example, the below described process may include fewer, or more steps. Also, it is to be appreciated that the present disclosure need not be limited to the initial integrated circuit system depicted by FIG. 1.

Referring now to FIG. 1, therein is shown a partial cross-sectional view of an integrated circuit system 100 in accordance with an embodiment of the present invention. The integrated circuit system 100 comprises a substrate 101 and shallow trench isolation structures 102 formed within the substrate 101. The integrated circuit system 100 may be divided into a first region and a second region denoted by reference characters 'A' and 'B' respectively. The first region A is where a trench having a relatively small line width is to be formed within the substrate and subsequently filled by selective epitaxy, and the second region B is where a trench having a relatively large line width is to be formed within the substrate and subsequently filled by selective epitaxy. First and second regions A and B may correspond to a cell region and a core/peripheral region respectively.

A pair of first devices (110a, 110b) and a second device 210 are formed in the first and second regions (A, B) respectively. In the presently described embodiment, the first and second devices may constitute NMOS and/or PMOS devices. As shown in FIG. 1, the first and second devices 110, 210 both include a gate stack comprising a gate dielectric (112, 212) formed over the substrate 101, a gate electrode (114, 214) overlying the gate dielectric (112, 212) and a gate cap (116, 216) overlying the top of the gate electrode (114, 214). The gate cap (116, 216) helps to protect the gate electrode during subsequent processing steps and may comprise of nitride. Surrounding the gate stack is an L-shaped first spacer (117, 217), and surrounding the first spacer is a second spacer (118, 218). Located below the gate dielectric (112, 212) within the substrate 101 is an MOS channel (120, 220). At this stage of manufacture, the first and second devices (110, 210) may also include a source/drain extension (122, 222) extending from the MOS channel (120, 220) in the substrate 101, and source/drain regions (124, 224) in the substrate that are offset from the MOS channel by the first and second spacers (117, 118). It is to be appreciated that the source/drain extension (122, 222) and/or source/drain regions (124, 224) may also be formed at subsequent stages of manufacturing while remaining in accord with the present invention.

Each of the foregoing substrate 101, gate dielectric (112, 212), gate electrode (114, 214), and spacers are generally conventional in the semiconductor fabrication art.

For example, the substrate 101 may comprise any semiconductor material such as but not limited to silicon, silicon-germanium, germanium, silicon carbide and silicon on insulator. Alternatively, other semiconductor substrates that physically and electrically enable the formation of active and/or passive device structures are also suitable.

The gate electrode (114, 214) may be formed from conductive or semi-conductive materials. Non-limiting examples include doped and undoped semiconductor materials (e.g. polysilicon, amorphous silicon or SiGe), metallic materials, a metallic alloy, a silicide, or a combination thereof. As for the gate dielectric (112, 212), it may comprise one or more layers of dielectric materials such as but not limited to silicon dioxide, silicon oxynitride, silicon nitride, a high-K metal oxide or a combination thereof or the like. The gate dielectric may be deposited using methods such as thermal oxidation, chemical vapor deposition, rapid thermal oxidation or the like as known in the art.

The first and second spacers may include dielectric materials such as silicon nitride, silicon oxide, TEOS, silicon oxynitride or combinations thereof. The spacers may be formed by depositing one or more dielectric layers over the gate electrode and etching the dielectric layer such that only the material adjacent to the gate electrode sidewalls remains. Apart from the spacer profile illustrated in FIG. 5, other types of spacers such as L-shaped spacers, disposable spacers, multiple spacers, offset spacers are also suitable. Accordingly, embodiments of the present invention may utilize different doping profiles depending on the spacer profile adopted.

Figure 2:
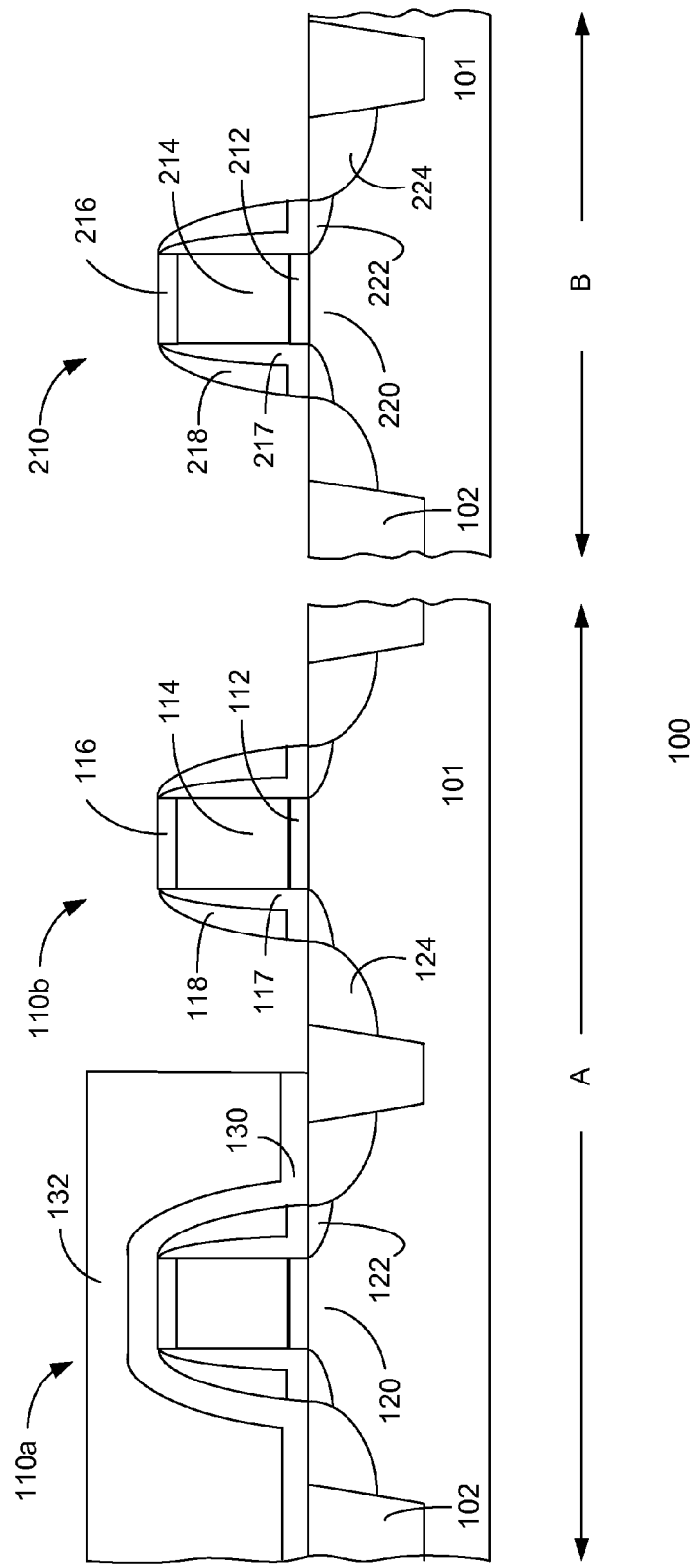

FIG. 2 illustrates the integrated circuit system 100 of FIG. 1 after the formation of a protective layer 130 and a mask layer 132 over one of the first devices 110a while leaving the other first device 110b exposed. The second device 210 is also left exposed. In one embodiment, the pair of first devices (110a, 110b) shown in FIG. 2 may be of opposite polarity type. For example, the first device 110a that is covered by the protective layer 130 and mask layer 132 may be an NMOS while the exposed first device 110b may be a PMOS. Alternatively, the arrangement may be reversed.

In one embodiment, the protective layer 130 may be formed over the entirety of the integrated circuit system 100 and subsequently patterned using the mask layer 132 to selectively remove portions of the protective layer overlying the PMOS device 110b and the second device 210. In one embodiment, the mask layer 132 may be a photoresist layer that is patterned by conventional lithography techniques and the protective layer 130 is selectively etched (for example by reactive ion etch) in accordance with the mask layer 132 to remove unprotected portions of the protective layer 130.

The protective layer 130 may comprise dielectric materials such as silicon nitride, silicon oxide or a combination thereof. Alternatively, other materials that block the deposition of a subsequent epitaxial layer are also suitable.

Figure 3:
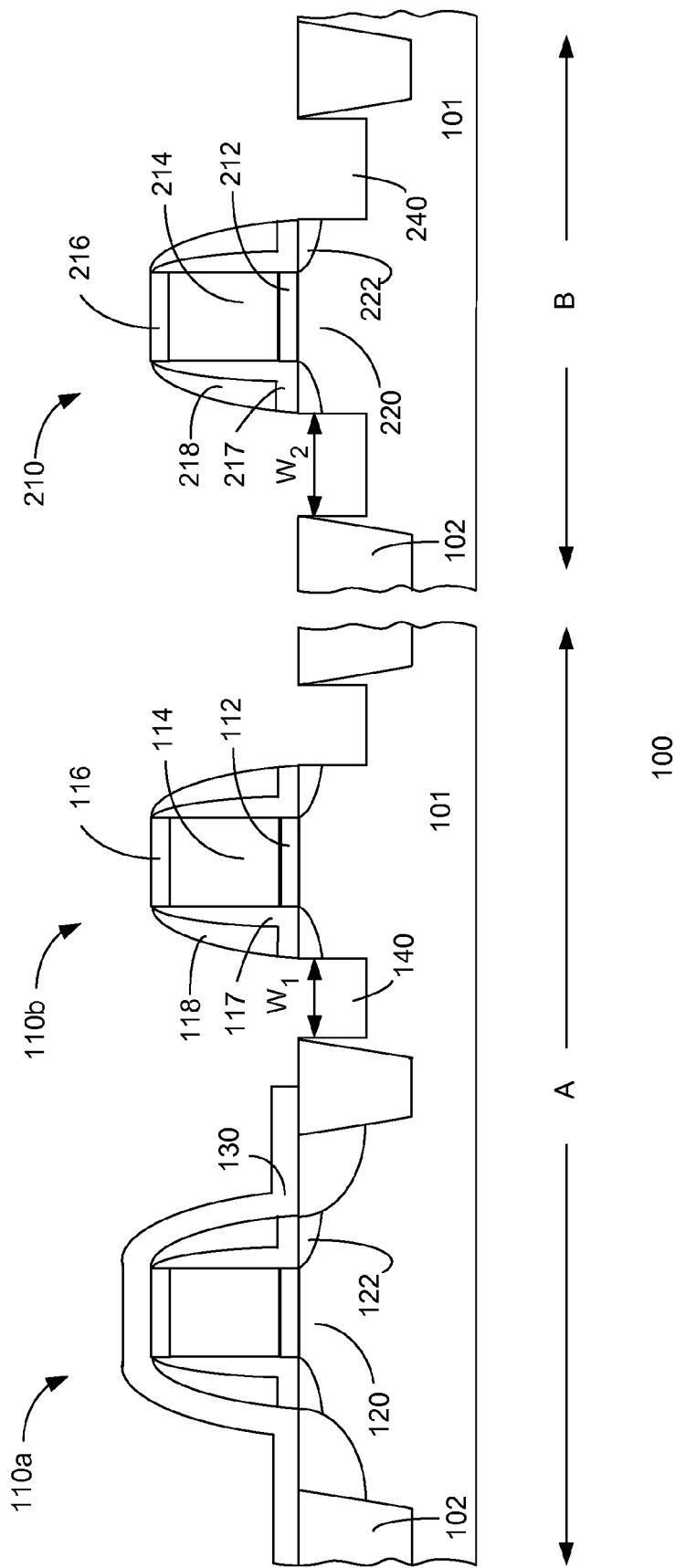

Referring now to FIG. 3, therein is shown the integrated circuit system 100 of FIG. 2 after the substrate 101 has been patterned using the mask and protective layer (130, 132) as an etching mask. This results in the formation of first recesses 140 within the substrate located in the first region A and second recesses 240 within the substrate located in the second region B. The first and second recesses are situated adjacent opposed sides of the gate stack associated with the exposed first and second devices (110b, 210). In FIG. 3, the first recesses 140 in the first region A have a width $W_1$ that is less than a width $W_2$ of the second recesses 240 in the second region B. The mask layer 132 may be removed after the first and second recesses (140, 240) have been formed.

In one embodiment, the first and second recesses (140, 240) are formed by an reactive ion etch (RIE) process that selectively etches the material chosen for the substrate while minimally etching other materials such as the mask layer 132, first spacer (117, 217), second spacer (118, 218) and gate cap (116, 216). As a result of the selective etch process, the first and second recesses (140, 240) are formed offset from the sidewalls of the gate electrode it is associated with by a width determined by the first and second spacers.

Figure 4:
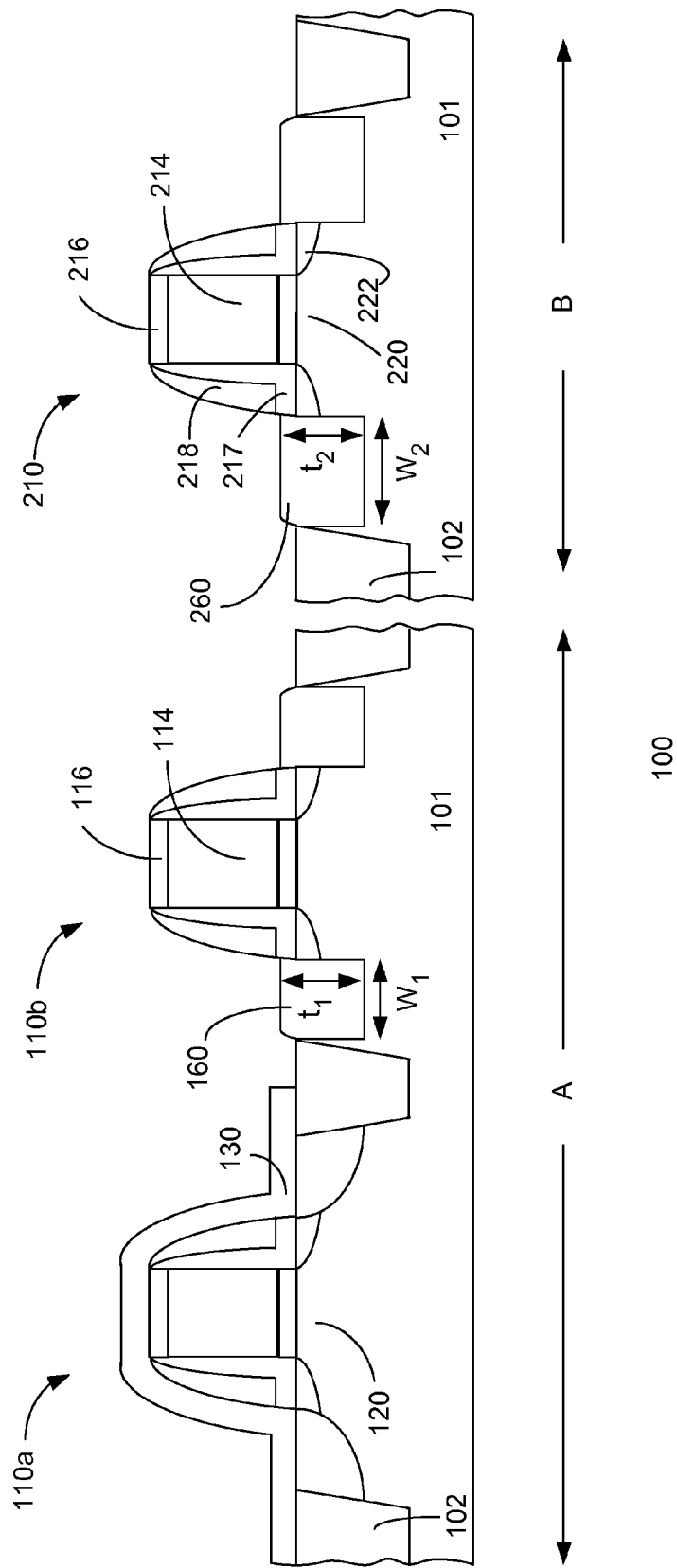

FIG. 4 shows the integrated circuit system 100 of FIG. 3 after the simultaneous formation of a first layer of epitaxial material 160 over the first recesses 140 and a second layer of epitaxial material 260 over the second recesses 240. Selective epitaxial deposition is used to selectively fill the first and second recesses (140, 240) formed within the substrate 101 with substantially no deposition of polycrystalline and/or amorphous material over other parts of the integrated circuit system 100. The first layer 160 deposited within the first recesses 140 in first region A has a thickness of $t_1$ while the second layer 260 deposited within the second recesses 240 in second region B has a thickness of $t_2$.

In one embodiment, the first and second layers may be stress inducing layers that comprise a material having a lattice constant different from that of the substrate 101. This mismatch in lattice constant causes a strain to be induced within the MOS channel (120, 220). In one embodiment, the substrate 101 is composed of silicon and the first and second layers (160, 260) comprise undoped silicon germanium (SiGe). Alternatively, other materials that are capable of inducing strain within the MOS channel may also be used as the first and second layer (160, 260). For example, the first and second layer of epitaxial material (160, 260) may comprise Silicon (Si), Silicon Carbide (SiC) or combinations of one or more of Si, SiC and SiGe. Moreover, the epitaxial layers (160, 260) may also be doped in-situ during the epitaxial process, for example, by incorporating dopant gases into the gas mixture.

In general, selective epitaxial deposition processes involve both deposition and etching reactions occurring simultaneously but with relatively different rates in relation to an epitaxial layer and a polycrystalline and/or amorphous layer. The deposition reactions result in epitaxial layers being grown over mono-crystalline surfaces while non mono-crystalline (e.g. polycrystalline and amorphous) layers are being grown over surfaces that do not have a mono-crystalline structure such as dielectric materials. The etch reactions on the other hand, etch away both the epitaxial and non mono-crystalline. In a selective epitaxial process, a balance between deposition and etching reactions is selected such that adatoms adsorbed on a mono-crystalline surface will remain sufficiently bound to ensure net epitaxial layer growth while adatoms located over a non mono-crystalline surface are etched away before they can form a stable polysilicon/amorphous nuclei. Using the example of FIG. 4 as an illustration, epitaxial process conditions may be adjusted so that there is a net deposition of epitaxial material within the recesses (140, 240) with substantially no simultaneous growth of crystalline/amorphous film on dielectric surfaces such as the first and second spacers, gate cap and isolation material filling the STI structures 102. In particular, the process conditions are adjusted so that the etch rate for polycrystalline material exceeds its deposition rate while the etch rate for epitaxial material is less than its deposition rate.

The inventors have discovered that with the scaling down of device dimensions, the effect of seed window area on epitaxial growth rate, also known as local loading effect, is enhanced. Seed window area refers to the two-dimensional size of an exposed surface where an epilayer is to be grown. In particular, when the seed window area dimensions are of a similar order of magnitude as the diffusion length of growth component adatoms, the impact of seed window area on growth rate can be significant. Silicon adatoms have a diffusion length of approximately 0.2 µm.

The inventors have discovered that local loading effect problem can be mitigated by using at least two source gases which exhibit for at least some of the seed window geometries, opposed growth rate versus seed window size behavior within the epitaxial deposition conditions of interest. Preferably, for selective epitaxial processes, the gas mixture used during deposition also includes an etching component for controlling the selectivity of the epitaxial layer growth. This etching component is distinct from the at least two source gases which act as growth components, and it advantageously allows etch selectivity to be tuned without substantially deviating from the optimal ratio of source gases needed to reduce loading effect.

In one embodiment, the first and second recesses (140, 240) in FIG. 4 are simultaneously filled with a respective first and second layer of epitaxial material (160,260) comprising Silicon Germanium (SiGe). The deposition process may be a low pressure chemical vapor deposition (LPCVD) process comprising the following combination of gases: silane ($SiH_4$) and dichlorosilane ($SiH_2Cl_2$) as silicon source gases, hydrogen chloride (HCL) as an etching component for controlling the selectivity of the epitaxial layer growth, germane ($GeH_4$) as a Ge precursor that reacts with silane and dichlorosilane to form SiGe and hydrogen ($H_2$) as a carrier gas. Silane and dichlorosilane are chosen as silicon source gases in this example because silane has a lower deposition rate relative to smaller seed window area while dichlorosilane exhibits the opposite behavior of a higher deposition rate relative to smaller seed window area. Generally, the silane versus dichlorosilane flow rate ratio is chosen such that variations in epitaxial layer deposition rate as a function of seed window size can be reduced. By way of example, the flow rate of silane can be set at approximately 40-60 sccm, the dichlorosilane flow rate between 90-110 sccm and the HCL flow rate around 65-85 sccm. However, it is to be understood that the ratio may vary depending on the settings for other process parameters such as process temperature, flow rate of other gases used in the epitaxial growth process e.g. HCL and/or germane. Therefore, the above settings are not limiting and may vary so as to provide at least two sources of epitaxial growth component exhibiting opposed growth rate versus seed window area trend for at least some of the seed windows, neither of the sources are significantly more dominant than the other.

The presence of a dedicated etching component such HCL in the above example also has its benefits compared to a scenario where only silane and dichlorosilane are used without a dedicated etching component. In the latter scenario, dichlorosilane is relied upon as an etching component and as such, deposition selectivity cannot be adjusted to a desired level without having an impact on the extent of loading observed. In particular, the dichlorosilane flow rate has to be maintained above a minimum level in order to provide a selective epitaxial process where there is no net growth of polysilicon on non-seed window regions. This is undesirable because the minimum level may exceed the amount of dichlorosilane flow rate required to compensate for underfill of smaller features. On the other hand, there is also an upper limit to the dichlorosilane versus silane flow rate ratio beyond which an etching environment with slow or no net growth of epitaxial material is observed. Therefore, by having a dedicated etching component, there is more latitude for adjusting the dichlorosilane versus silane ratio to a value which mitigates the effect of seed window size on growth rate while still maintaining a selective epitaxy process.

Apart from the above combination of silane and dichlorosilane, other silicon source gases may also be used as an alternative or in combination to deposit a SiGe epitaxial layer (160, 260). For example, Disilane ($Si_2H_6$), Trisilane ($Si_3H_8$) may also be used as an alternative or in addition to $SiH_4$ and/or $SiH_2Cl_2$. Nitrogen may also be used as a carrier gas in place of hydrogen.

Figure 5:
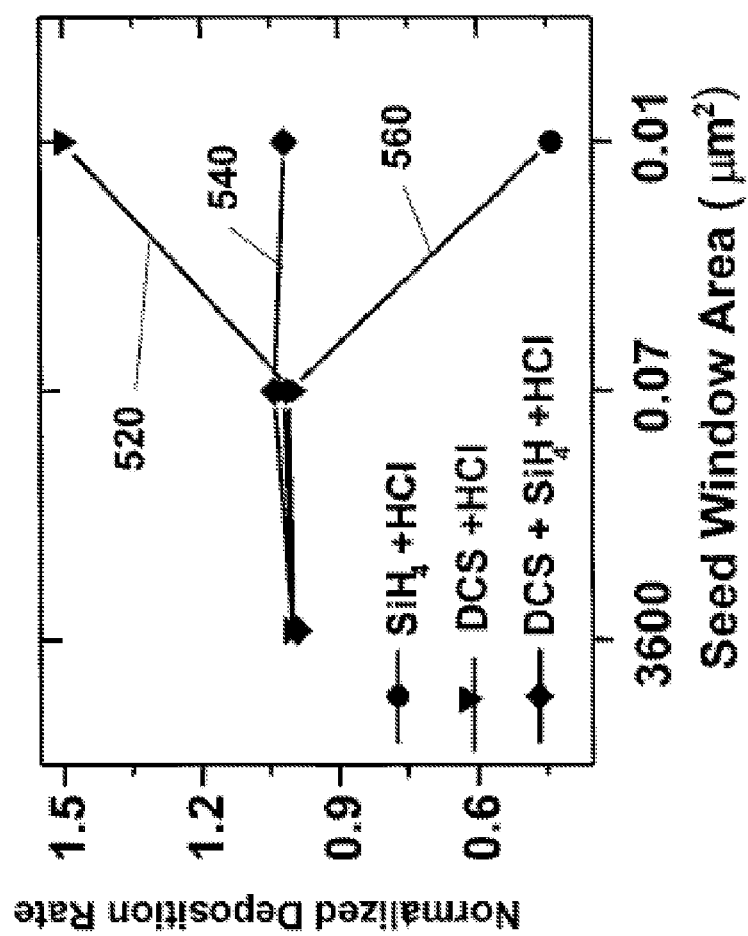
FIG. 5 is a graph illustrating the normalized deposition rate versus seed window area trend when Silicon Germanium (SiGe) is grown under three different epitaxial process conditions.

FIG. 5 is a graph showing the normalized deposition rate versus seed window area variation for an experiment where a SiGe epitaxial film is selectively grown over exposed silicon surfaces or seed windows having an area of 3600 $um^2$, 0.07 $um^2$ and 0.01 $um^2$ respectively. Areas surrounding the seed windows are masked by silicon nitride and there is substantially no net growth in this region. The substrates are subjected to a cleaning process (such as RCA) to remove native oxide from the seed windows before a SiGe epitaxial film is grown.

In FIG. 5, the growth rate for the 0.07 and 0.01 $um^2$ seed window areas are normalized with respect to the growth rate for the 3600 $um^2$ seed window of each process condition. The plot denoted by reference numeral 520 represents the trend for a selective epitaxial process where only dichlorosilane is used as the silicon source gas and HCL is used as the etching component while the plot denoted by reference numeral 560 is for a selective epitaxial process where only silane is used as the silicon source gas and HCL acts as the etching component. In both 520 and 560, the proportion of HCL relative to silane and dichlorosilane is adjusted such that there is no net growth in the nitride regions. The thickness of the SiGe epitaxial films may be characterized using high resolution transmission electron microscopy (HRTEM) and ellipsometric techniques.

As evident from FIG. 5, experimental results for the dichlorosilane and silane only processes (520, 560) indicate that for seed window area of less than 0.07 um$^2$, variations in seed window area have a significant impact on the deposition rate of SiGe. Specifically, the use of dichlorosilane as a silicon growth component leads to an increase in deposition rate as seed window size is reduced below 0.07 um$^2$ while the silane process 560 shows the opposite trend, that is, the deposition rate decreases as seed window size is reduced below 0.07 um$^2$. Applying the results of FIG. 5 to the example in FIG. 4 where the first and second recesses (140, 240) have the same length (dimension extending into the plane of the paper) and depth but different widths of W$_1$ and W$_2$ respectively, differences in SiGe growth rate can result in the first and second layer thickness, t$_1$ and t$_2$ that are significantly different. For example, assuming that the first and second recesses have an area of 0.01 um$^2$ and 0.07 um$^2$ respectively and dichlorosilane is used as the silicon source gas to provide a SiGe epilayer, the epitaxy thickness t$_1$ of the first layer 160 will be higher compared to the thickness t$_2$ of the second layer 260. Under certain circumstances, this difference in growth rate may lead to an overfill of epitaxial material for the first recess 140 and underfill of epitaxial material for the second recess 240 thus potentially leading to a degradation in first and/or second device performance.

Without limiting ourselves to any particular theory, the inventors are of the opinion that the availability of adsorbed growth component adatoms for epitaxial growth at the seed windows becomes important when the size of the seed window is reduced to a similar order of magnitude as the diffusion length of growth component adatoms. For the case of silicon adatoms which have a diffusion length of approximately 0.2 μm, the critical area is around 0.04 μm$^2$. The availability of adatoms for epitaxial growth at seed windows may be dependant on the behavior of the respective adsorbed species in relation to seed window regions versus the surrounding e.g. dielectric covered areas. For example, in FIG. 5, when using dichlorosilane as a source gas, there appears to be an influx of Si-containing adatoms from the nitride area to the seed windows, whereas for silane, there seems to be an outflow of Si-containing adatoms from the seed windows to the surrounding nitride. As a consequence, with dichlorosilane, there are more adsorbed Si-containing species available in seed windows as compared to silane. Differences in availability of adatoms for different types of source gases may also be attributed to differences in other surface reaction mechanisms such as interaction with the etching component e.g. HCL and reaction to differences in thermal emissivity exhibited by seed windows of different size.

Applying the inventors' concept of using at least two source gases which exhibit opposed growth rate versus seed window size behavior, SiGe is selectively grown over a nitride masked silicon wafer similar to that used in the processes associated with plot 520 and 560 but using both silane and dichlorosilane source gases as Si growth components for simultaneously forming a SiGe epitaxial film over seed windows having an area of 3600 um$^2$, 0.07 um$^2$ and 0.01 um$^2$. HCL is also included in the gas combination as a separate etching component to control the selectivity of the epitaxial process. Plot 560 represents the resultant normalized growth rate variation with seed window area for the above-described process. As evident from FIG. 5, the variation in epitaxial growth rate with seed window size can be substantially reduced when a suitable ratio of silane and dichlorosilane is used as silicon growth components compared to a single silicon source gas process like those represented by 520 and 540. This is due to the combination of silane and dichlorosilane exhibiting opposed epitaxial growth rate behavior as seed window area is reduced below 0.07 μm$^2$. For example in one experiment, a flow ratio of 10:16:15 for silane:dichlorosilane:HCL produced a growth rate of 5.9, 6.1 and 6.0 Å/s for the 3600, 0.07 and 0.01 μm$^2$ windows respectively.

The preferred embodiment of the invention is an illustrative of the invention rather than limiting of the invention. It is to be understood that revisions and modifications may be made to methods, materials, structures and dimensions of a semiconductor structure while still providing a semiconductor that fall within the scope of the included claims. All matters hitherto set forth herein or shown in the accompanying drawings are to be interpreted in an illustrative and non-limiting sense.

What is claimed is:

1. A method for fabricating a semiconductor device comprising:
   providing a substrate comprising a first and second device structures;
   forming a first and a second exposed portions of the substrate adjacent to the first and second device structures respectively, wherein the first and second exposed portions are of different sizes; and
   simultaneously forming a first layer over the first and second exposed portions of the substrate, the formation comprising a deposition process and an etch process occurring simultaneously, wherein
      the deposition process uses at least two growth components with opposed growth rates versus width of the recess to reduce loading effects, and
      the etch process uses an etching component distinct from the at least two growth components for controlling selectivity of growths of the first layer in the first and second device structures.

2. The method as claimed in claim 1, wherein the first and second exposed portions of the substrate comprises a different material from other exposed portions of the substrate.

3. The method as claimed in claim 2, wherein selectively forming the first layer comprises selectively growing the first layer in an epitaxial process.

4. The method as claimed in claim 3, wherein the first layer comprises one of Si, SiGe or SiC or a combination of one or more thereof.

5. The method as claimed in claim 3, wherein the first and second source gases are silicon source gases.

6. The method as claimed in claim 5, wherein the first source gas is silane and the second source gas is dichlorosilane.

7. The method as claimed in claim 3, wherein the etching component comprises HCL.

8. The method as claimed in claim 3, wherein the first and second exposed portions have a seed window area of 0.07 um$^2$ or less.

9. The method as claimed in claim 1, wherein the first and second device structures each comprise a gate stack including a gate dielectric formed over the substrate and a gate electrode overlying the gate dielectric, and spacers surrounding the gate stack.

10. The method as claimed in claim 9, wherein the first layer is selectively formed in an epitaxial process.

11. The method as claimed in claim 10, wherein the first layer is a stress inducing layer.

12. The method as claimed in claim 11, wherein the first and second exposed portions of the substrate are trenches formed within the substrate.

13. The method as claimed in claim 11, wherein the first layer comprises SiGE.

14. The method as claimed in claim 13, wherein the first source gas is silane and the second source gas is dichlorosilane.

15. The method as claimed in claim 14, wherein the etching component comprises HCL.

16. The method as claimed in claim 14, wherein the flow rate of silane is between around 40-60 sccm and the flow rate of dichlorosilane is between around 90-110 sccm.

17. The method as claimed in claim 1, wherein the ratio of the first and second source gases is such neither of the sources is significantly more dominant than the other.

18. A method for fabricating a semiconductor device comprising:
    providing a substrate comprising a first and second device structures;
    forming a first and a second exposed portions of the substrate adjacent to the first and second device structures respectively, wherein the first and second exposed portions are of different sizes, the first and second exposed portions comprising different materials from other exposed portions of the substrate; and
    selectively forming a first layer over the first and second exposed portions of the substrate, the formation comprising a deposition process and an etch process occurring simultaneously, wherein
        the deposition process uses at least two growth components with opposed growth rates versus width of the recess to reduce loading effects, and
        the etch process uses an etching component distinct from the at least two growth components for controlling selectivity of growths of the first layer in the first and second device structures.

19. A method for forming a device comprising:
    providing a substrate prepared with first and second recesses, a width W1 of the first recess being different than a width W2 of the second recess; and
    forming a device layer over the first and second recesses, the formation comprising a deposition process and an etch process occurring simultaneously, wherein
        the deposition process uses at least two growth components with opposed growth rates versus width of the recess to reduce loading effects, and
        the etch process uses an etching component distinct from the at least two growth components for controlling selectivity of growths of the device layer in the first and second recesses.

20. The method in claim 19 wherein forming the device layer comprises selectively growing the device layer in an epitaxial process.

* * * * *